(12) United States Patent
Sasaoka et al.

(10) Patent No.: US 9,953,962 B2
(45) Date of Patent: Apr. 24, 2018

(54) LIGHT EMITTING DEVICE

(71) Applicant: NICHIA CORPORATION, Anan-shi (JP)

(72) Inventors: Shimpei Sasaoka, Tokushima (JP); Kazuto Okamoto, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/857,944

(22) Filed: Sep. 18, 2015

(65) Prior Publication Data

US 2016/0086927 A1 Mar. 24, 2016

(30) Foreign Application Priority Data

Sep. 19, 2014 (JP) ................. 2014-191049

(51) Int. Cl.
*H01L 25/075* (2006.01)
*H01L 33/50* (2010.01)

(52) U.S. Cl.
CPC ........ *H01L 25/0753* (2013.01); *H01L 33/508* (2013.01); *H01L 2224/16225* (2013.01); *H01L 2224/45144* (2013.01); *H01L 2224/48091* (2013.01); *H01L 2224/48137* (2013.01); *H01L 2224/48247* (2013.01); *H01L 2224/48257* (2013.01); *H01L 2224/49107* (2013.01); *H01L 2924/181* (2013.01)

(58) Field of Classification Search
None
See application file for complete search history.

(56) References Cited

U.S. PATENT DOCUMENTS

| | | | | |
|---|---|---|---|---|
| 2006/0038477 A1* | 2/2006 | Tamaki | ............... | C01B 21/0602 313/485 |
| 2008/0237614 A1* | 10/2008 | Ishikura | .............. | H01L 25/0753 257/89 |
| 2011/0211348 A1 | 9/2011 | Kim | | |
| 2011/0215349 A1* | 9/2011 | An | .......................... | H01L 33/08 257/89 |

(Continued)

FOREIGN PATENT DOCUMENTS

| | | |
|---|---|---|
| JP | 2004-356116 | 12/2004 |
| JP | 2005-101660 | 4/2005 |

(Continued)

*Primary Examiner* — Steven B Gauthier
(74) *Attorney, Agent, or Firm* — Mori & Ward, LLP

(57) ABSTRACT

A light emitting device includes a base, a first light emitting element, a second light emitting element, and a sealing member. The first light emitting element has an active layer of a nitride semiconductor and has a first emission peak wavelength in a blue region. The second light emitting element has an active layer of a nitride semiconductor and has a second emission peak wavelength longer than the first emission peak wavelength of the first light emitting element. The sealing member includes a first region and a second region. The first region contains a phosphor to be excited by light from the first light emitting element. The first region is provided on an element mounting surface. A first upper surface of the first light emitting element is located in the first region. The second region does not substantially contain the phosphor and is provided on the first region.

24 Claims, 1 Drawing Sheet

(56) References Cited

U.S. PATENT DOCUMENTS

2014/0231746 A1* 8/2014 Hyun .................... H01L 33/025
                                                      257/13
2015/0329770 A1* 11/2015 Kaneyoshi ........... C09K 11/025
                                                      252/301.36

FOREIGN PATENT DOCUMENTS

| JP | 2007-150233 | 6/2007 |
| JP | 2008-251644 | 10/2008 |
| JP | 2009-099715 | 5/2009 |
| JP | 2011-216891 | 10/2011 |
| JP | 2011-249807 | 12/2011 |

* cited by examiner

LIGHT EMITTING DEVICE

CROSS-REFERENCE TO RELATED APPLICATIONS

The present application claims priority under 35 U.S.C. § 119 to Japanese Patent Application No. 2014-191049, filed Sep. 19, 2014. The contents of this application are incorporated herein by reference in their entirety.

BACKGROUND

Technical Field
The present disclosure relates to a light emitting device.
Discussion of the Background
For example, Japanese Unexamined Patent Application Publication No. 2009-099715 describes a light emitting device having a plurality of light emitting diode (LED) chips mounted on electrodes of different heights formed on a mounting substrate surface. Japanese Unexamined Patent Application Publication No. 2009-099715 also describes that the LED chips may be sealed with transparent resin containing a phosphor which is excited by an emission wavelength of the LED chip and which emits light of a different wavelength from the emission wavelength of the LED chip, and also that several kinds of LED chips, such as a red LED chip, a green LED chip, a blue LED chip, a purple LED chip, and the like, may be used in combination.

SUMMARY OF THE INVENTION

According to one aspect of the present invention, a light emitting device includes a base, a first light emitting element, a second light emitting element, and a sealing member. The base has an element mounting surface. The first light emitting element has an active layer of a nitride semiconductor and has a first emission peak wavelength in a blue region. The first light emitting element has a first upper surface and a first lower surface opposite to the first upper surface and is provided on the element mounting surface so that the first lower surface faces the element mounting surface. The second light emitting element has an active layer of a nitride semiconductor and has a second emission peak wavelength longer than the first emission peak wavelength of the first light emitting element. The second light emitting element has a second upper surface and a second lower surface opposite to the second upper surface and is provided on the element mounting surface so that the second lower surface faces the element mounting surface. The sealing member is provided on the element mounting surface to seal the first light emitting element and the second light emitting element. The sealing member includes a first region and a second region. The first region contains a phosphor to be excited by light from the first light emitting element. The first region is provided on the element mounting surface. The first upper surface of the first light emitting element is located in the first region. The second region does not substantially contain the phosphor and is provided on the first region. The second upper surface of the second light emitting element is located in the second region.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
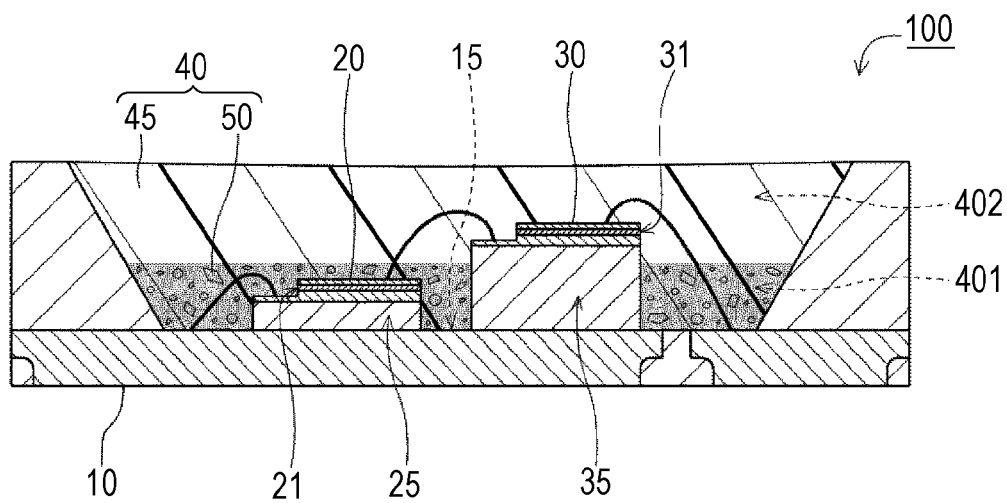
FIG. 1 is a schematic sectional view of a light emitting device according to one embodiment of the present invention.

The embodiments will now be described with reference to the accompanying drawings, wherein like reference numerals designate corresponding or identical elements throughout the various drawings.

Hereinafter, embodiments of the present invention will be described appropriately with reference to the drawings. Note that light emitting devices described below embody technical ideas of the present invention, and therefore the present invention is not limited to the embodiments described below unless otherwise specified. Moreover, details described in one embodiment and one Example are also applicable to another embodiment and another Example. Furthermore, the sizes, positional relationship, and the like of members shown in the drawings may be exaggerated for clarity.

Hereinafter, a visible wavelength region is in a wavelength range between 380 nm and 780 nm (both inclusive), a blue region is in a wavelength range between 420 nm and 480 nm (both inclusive), a green region is in a wavelength range between 500 nm and 560 nm (both inclusive), and a red region is in a wavelength range between 610 nm and 750 nm (both inclusive).

First Embodiment

FIG. 1 is a schematic sectional view of a light emitting device according to the first embodiment.

As shown in FIG. 1, the light emitting device 100 according to the first embodiment is a package-type light emitting diode adopting a top emitting (top view) type or a side emitting (side view) type. The light emitting device 100 includes a base member 10 ("a base member" is also referred to as "a base"), a first light emitting element 20, a second light emitting element 30, and a sealing member 40.

The base member 10 of this embodiment is a package including lead electrodes and a molded body integrally molded with the lead electrodes. The base member 10 has an element mounting surface 15. The element mounting surface 15 is a bottom surface of a recess portion of the package, more specifically is an upper surface of the lead electrodes.

The first light emitting element 20 is provided on the element mounting surface 15. The first light emitting element 20 is face-up mounted. The first light emitting element 20 has an active layer 21 made of a nitride semiconductor. The first light emitting element 20 has an emission peak wavelength in the blue region. In particular, the first light emitting element 20 preferably has an emission peak wavelength in a range between 445 nm and 465 nm (both inclusive) in terms of luminous efficiency, color mixture with light of another light source, excitation efficiency of a phosphor, and the like.

The second light emitting element 30 is provided on the element mounting surface 15. The second light emitting element 30 is face-up mounted. The second light emitting element 30 has an active layer 31 made of a nitride semiconductor. The second light emitting element 30 has a longer emission peak wavelength than that of the first light emitting element 20. The second light emitting element 30 is serially connected to the first light emitting element 20 with a wire.

The sealing member 40 is provided on the element mounting surface 15. More specifically, the sealing member 40 is filled in the recess portion of the package. A base material 45 of the sealing member is light-transmissive resin. The sealing member 40 contains a phosphor 50 excited by light of the first light emitting element 20. The sealing member 40 seals the first light emitting element 20 and the second light emitting element 30. The sealing member 40 includes: in order from an element mounting surface 15 side, a first region 401 where the phosphor 50 lies; and a second region 402 where substantially no phosphor lies. The first region 401 and the second region 402 are each in the form of a layer. The first region 401 includes: the base material 45 and the phosphor 50; or the base material 45, the phosphor 50, and a filler. The second region 402 substantially includes: only the base material 45; or the base material 45 and the filler.

A height of an upper surface of the first light emitting element 20 is a height in the first region 401, and a height of an upper surface of the second light emitting element 30 is a height in the second region 402. In this embodiment, the upper surface of this first light emitting element 20 and the upper surface of the second light emitting element 30 are surfaces on a light emitting element structure (a semiconductor laminate) side. Here, "height" refers to a distance from (a bottom of) the element mounting surface 15.

The light emitting device 100 having such a configuration can suppress light loss caused by diffusing and absorbing, with the phosphor 50, light exiting from the second light emitting element 30 having a relatively long emission peak wavelength. As described above, relatively increasing efficiency of extracting light of the second light emitting element 30 to an outside of the device can increase luminous efficiency of the second light emitting element 30 in a pseudo manner. This can consequently provide a light emitting device which emits light of mixed colors of multiple wavelengths with high luminous efficiency.

Providing the height of the upper surface of the first light emitting element 20 as the height in the first region 401 allows efficient emission of the phosphor 50.

Further, as shown in FIG. 1, it is preferable that a height of the active layer 21 of the first light emitting element be a height in the first region 401 and a height of the active layer 31 of the second light emitting element be a height in the second region 402. Providing such a height as the height of the active layer 31 serving as a light emission source of the second light emitting element 30 can more suppress the light loss caused by diffusing and absorbing, with the phosphor 50, the light exiting from the second light emitting element 30.

As shown in FIG. 1, in the light emitting device 100, the first light emitting element 20 has a substrate 25, and the second light emitting element 30 has a substrate 35. The substrate 35 of the second light emitting element 30 is thicker than the substrate 25 of the first light emitting element 20. This makes it easy to adjust the height of the upper surface of the second light emitting element 30 at the height in the second region 402. Moreover, providing the relatively thick substrate 35 can improve the luminous efficiency of the second light emitting element 30.

As shown in FIG. 1, in the light emitting device 100, the first light emitting element 20 and the second light emitting element 30 are provided substantially in the same plane. In the case where the element mounting surface of the base member is a plane, such a base member can be relatively inexpensive and allows easy mounting of the light emitting elements.

As shown in FIG. 1, in the light emitting device 100, the first light emitting element 20 and the second light emitting element 30 are provided on the same lead electrode. As a result, the first light emitting element 20 and the second light emitting element 30 are provided at a relatively close distance from each other, and light exiting from the first light emitting element 20 and the light exiting from the second light emitting element 30 are easily mixed. On the other hand, the first light emitting element 20 and the second light emitting element 30 may be provided on the corresponding separate lead electrodes. In this cases, the first light emitting element 20 and the second light emitting element 30 are so provided as to be relatively distant from each other, allowing suppression of light loss caused by mutual light absorption.

The longest emission wavelength region of a general-purpose nitride semiconductor light emitting element is a green region. Thus, providing the emission peak wavelength of the second light emitting element 30 in the green region is preferable since it easily brings about the effects of the embodiment of the present invention. In particular, the emission peak wavelength of the second light emitting element 30, if in the green region, is preferably in a range between 520 nm and 560 nm (both inclusive) in terms of the luminous efficiency, color mixture with light of another light source, and the like.

A difference in the emission peak wavelength between the first light emitting element 20 and the second light emitting element 30 is, for example but not limited to, 5 nm or more, preferably 10 nm or more, more preferably 30 nm or more, and even more preferably 50 nm or more.

The phosphor 50 preferably has an emission peak wavelength in the red region. This makes it possible to achieve white light emission by mixture of light exiting from the first light emitting element 20, from the second light emitting element 30, and from the phosphor 50. In particular, the emission peak wavelength of the phosphor 50, if in the red region, is preferably in a range between 620 nm and 670 nm (both inclusive) in terms of luminous efficiency, color mixture with light of another light source, and the like.

In an example illustrated, a boundary between the first region 401 and the second region 402 is formed into a planar shape substantially parallel to the element mounting surface 15, but its shape is not limited thereto and may be, for example, curved or uneven and thus may be appropriately determined depending on distribution of the phosphor 50. For example, as a result of distributing the phosphor 50 around the first light emitting element 20 depending on a shape of the first light emitting element 20 or distributing the phosphor 50 along a side surface of the second light emitting element 30 or a side wall surface of a recess portion, the first region 401 may be formed into a protruding shape. Moreover, the phosphor 50, in the sealing member 40, may be so distributed as to be eccentric toward the first light emitting element 20, that is, may be more distributed on a first light emitting element 20 side than on a second light emitting element 30 side.

The first region 401 and the second region 402 can be formed, in a process of forming the sealing member 40, for example, by dropping a liquid material containing the base material 45 and the phosphor 50 onto the element mounting surface 15 and settling the phosphor 50 and/or by dividing the liquid material of the sealing member 40 into a first material containing the base material 45 and the phosphor 50 and a second material containing the base material 45 but substantially not containing the phosphor and then sequentially dropping them onto the element mounting surface 15. Moreover, it is preferable that, in the process of forming the sealing member 40, the liquid material containing the base material 45 and the phosphor 50 be dropped at a position avoiding an area above the second light emitting element 30, for example, on a side of the first light emitting element 20 opposite to the second light emitting element 30, or immediately above the first light emitting element 20. This consequently makes it possible to suppress or avoid presence of the phosphor 50 on the upper surface of the second light emitting element 30. To divide the liquid material of the sealing member 40 into two, it is preferable that the second material be dropped on the second light emitting element 30 side, for example, on a side of the second light emitting element 30 opposite to the first light emitting element 20 or immediately above the second light emitting element 30. This makes it possible to remove the phosphor 50 disposed near the second light emitting element 30 (on the upper surface of the second light emitting element 30 in particular). It is preferable in terms of performance of sealing between the first region 401 and the second region 402 that the first material and the second material be simultaneously solidified, but the first material may be preliminarily solidified before the dropping of the second material. Alternatively, the first region 401 and the second region 402 can be formed by attaching the phosphor 50 onto the element mounting surface 15 (on the first light emitting element 20 side in particular) through, for example, a spraying method or an electrodeposition method and then dropping the liquid material containing the base material 45 but substantially not containing the phosphor with part thereof impregnated in the phosphor 50 and solidifying the liquid material Second Embodiment FIG. 2 is a schematic sectional view of the light emitting device according to the second embodiment of the present invention.

Figure 2:
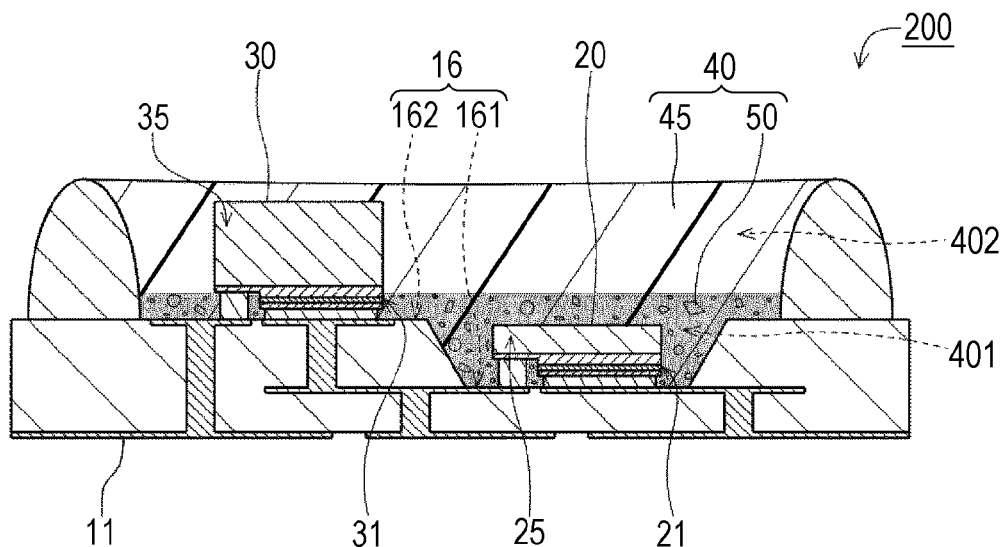
FIG. 2 is a schematic sectional view of a light emitting device according to one embodiment of the present invention.

As shown in FIG. 2, the light emitting device 200 according to the second embodiment is a light emitting diode of a chip-on board (COB) type adopting a top emitting (top view) type or a side emitting (side view) type. The light emitting device 200 includes a base member 11, a first light emitting element 20, a second light emitting element 30, and a sealing member 40.

The base member 11 of this embodiment is a wiring board including a base material and wiring formed on this base material. The base member 11 has an element mounting surface 16. The element mounting surface 16 is an upper surface of the wiring board.

The first light emitting element 20 is provided on the element mounting surface 16. The first light emitting element 20 is flip-chip mounted. The first light emitting element 20 has an active layer 21 made of a nitride semiconductor. The first light emitting element 20 has an emission peak wavelength in the blue region.

The second light emitting element 30 is provided on the element mounting surface 16. The second light emitting element 30 is flip-chip mounted. The second light emitting element 30 has an active layer 31 made of a nitride semiconductor. The second light emitting element 30 has a longer emission peak wavelength than that of the first light emitting element 20. Moreover, the substrate 35 of the second light emitting element 30 is thicker than the substrate 25 of the first light emitting element 20. The second light emitting element 30 is serially connected to the first light emitting element 20 by the wiring of the wiring board. Moreover, a terminal structure of the wiring board allows emission of only one or both of the first light emitting element 20 and the second light emitting element 30.

The sealing member 40 is provided on the element mounting surface 16. More specifically, the sealing member 40 is filled inside a frame-like projection (made of resin containing white pigment) provided on an upper surface of the wiring board. A base material 45 of the sealing member is light-transmissive resin. The sealing member 40 contains a phosphor 50 excited by light of the first light emitting element 20. The sealing member 40 seals the first light emitting element 20 and the second light emitting element 30. The sealing member 40 includes in order from an element mounting surface 16 side: a first region 401 where the phosphor 50 lies; and a second region 402 where substantially no phosphor lies. The first region 401 and the second region 402 are each in the form of a layer. The first region 401 includes: the base material 45 and the phosphor 50; or the base material 45, the phosphor 50, and a filler. The second region 402 substantially includes: only the base material 45; or the base material 45 and a filler.

A height of an upper surface of the first light emitting element 20 is a height in the first region 401, and a height of an upper surface of the second light emitting element 30 is a height in the second region 402. In this embodiment, the upper surface of the first light emitting element 20 and the upper surface of the second light emitting element 30 are surfaces of the substrates 25 and 35. Note that "height" here refers to (a bottom of) the element mounting surface 16.

The light emitting device 200 having such a configuration can also be provided as a light emitting device which emits light of mixed colors of multiple wavelengths with high luminous efficiency while suppressing light loss caused by diffusing and absorbing, with the phosphor 50, light exiting from the second light emitting element 30 having a relatively long emission peak wavelength. Moreover, providing the height of the upper surface of the first light emitting element 20 as the height in the first region 401 allows efficient emission of the phosphor 50.

As shown in FIG. 2, in the light emitting device 200, the element mounting surface 16 has a lower stage 161 and an upper stage 162. More specifically, the element mounting surface 16 has a recess on part of a main surface, and a bottom surface of the recess serves as the lower stage 161 and the main surface serves as the upper stage 162. The first light emitting element 20 is provided at the lower stage 161, and the second light emitting element 30 is provided at the upper stage 162. This makes it easy to adjust the height of the upper surface of the first light emitting element 20 at the height in the first region 401 and the height of the upper surface of the second light emitting element 30 at the height in the second region 402. A side surface of the recess is tilted with its aperture diameter increasing upwardly from the lower stage 161 so that the light of the first light emitting element 20 can easily be extracted.

As shown in FIG. 2, in the light emitting device 200, a height of the active layer 31 of the second light emitting element 30 is the height in the first region 401 but the entire substrate 35 is at the height in the second region 402. As described above, in a case where the second light emitting element 30 is flip-chip mounted, more than a half of the substrate 35 is preferably at the height in the second region 402 and the entire substrate 35 is more preferably at the height in the second region 402. As a result, light is transmitted from the active layer 31 into the substrate 35 and further extracted from the substrate 35 via the second region 402, thereby making it easy to suppress the light loss caused by scattering and absorbing the light with the phosphor 50.

As shown in FIG. 2, in the light emitting device 200, the first region 401 also extends over the second light emitting element 30 side, but the almost entire first region 401 can be stored in the recess of the element mounting surface 16.

Hereinafter, components of the light emitting device of the embodiment of the present invention will be described.

Base Member 10

The base member is a member serving as a housing or a seat on which the light emitting elements are mounted. More specifically, examples of the base member include: one formed by integrally molding a resin molded body with lead electrodes through, for example, transfer molding or injection molding; and one formed by laminating and burning a ceramic green sheet with conductive paste printed thereon. The element mounting surface of the base member is preferably almost flat, but may be curved. As the base member, for example, one formed into a plate-like shape or one having a recess portion (cup part) can be used. The recess portion may be formed by recessing the molded body or the base material itself. Alternatively, a frame-like projection is separately formed on an upper surface of the almost flat molded body or base material, thus providing an inside of this projection as the recess portion. Shapes of the recess portion in a top view include a rectangle, a rectangle with rounded corners, a circle, and an ellipse. A side wall surface of the recess portion is preferably tilted (including "curved") with an aperture diameter of the recess portion increasing upwardly from the bottom surface of the recess portion so that the molded body can easily be separated from the mold and also for the purpose of efficiently extracting the light of the light emitting elements (a tilt angle is, for example, between 95 degrees and 120 degrees (both inclusive) relative to the bottom surface of the recess portion). A depth of the recess portion is not specifically limited, and is, for example, between 0.05 mm and 2 mm (both inclusive), preferably between 0.1 mm and 1 mm (both inclusive), and more preferably between 0.25 mm and 0.5 mm (both inclusive).

Package

A material used for the lead electrode may include metal that can be connected to the light emitting elements to conduct electricity. More specifically, examples of this material include copper, aluminum, gold, silver, tungsten, iron, nickel, cobalt, and molybdenum, and an alloy of these substances, phosphor bronze, and a copper-iron alloy. In particular, the copper alloy primarily containing copper is preferable. Moreover, provided on its surface layer may be plating of, for example, silver, aluminum, rhodium, gold, copper, or an alloy of these substances, or a light reflective layer, among which the silver having good light reflectivity is preferable. The lead electrode has, for example, a lead frame divided into a separate individual piece as part of the individual light emitting device through cut-forming. The lead frame has a base material obtained by performing various processing such as pressing, etching, and rolling on a metal plate formed of the aforementioned material. A thickness of the lead electrode can be selected arbitrarily, for example, between 0.1 mm and 1 mm (both inclusive), and preferably between 0.2 mm and 0.4 mm (both inclusive).

The molded body is integrally molded with the lead electrodes, forming the package. The molded body is a solidified substance primarily of white or black resin. Examples of a base material of the molded body include: thermoplastic resin such as polyamide resin, polyethylene terephthalate, polycyclohexane terephthalate, liquid crystal polymer, and polycarbonate resin; and thermosetting resin such as polybismaleimide-triazine resin, epoxy resin, modified epoxy resin, silicone resin, modified silicone resin, and polyimide resin. These base materials can contain as a filler or coloring pigment, particles or fibers of, for example, glass, silica, titanium oxide, magnesium oxide, magnesium carbonate, magnesium hydroxide, calcium carbonate, calcium hydroxide, calcium silicate, magnesium silicate, wollastonite, mica, zinc oxide, barium titanate, potassium titanate, aluminum borate, aluminum oxide, zinc oxide, silicon carbide, antimony oxide, zinc stannate, zinc borate, iron oxide, chromium oxide, manganese oxide, and carbon black.

Wiring Board

A base material of the wiring board preferably has electrical insulation properties, but even one with electrical conductivity can be electrically insulated from the wiring with an insulation film or the like interposed therebetween. Examples of a material of the base material of the wiring board include: ceramics containing aluminum oxide, aluminum nitride, and a mixture of these substances; metal containing copper, iron, nickel, chrome, aluminum, silver, gold, titanium, and an alloy of these substances; resin such as epoxy resin, BT resin, and polyimide resin, and fiber reinforced resin of these resin (e.g. glass for reinforced material). The wiring board can be provided as a rigid board or a flexible board, depending on the material and the thickness of the base material. Moreover, the wiring board is not limited to a flat-plate-like form, but can be in a form having a recess portion as is the case with the aforementioned package.

Wiring

The wiring is formed on at least an upper surface of the base material, and may also be formed on an inside, a lower surface, and a side surface of the base material. Moreover, the wiring may have a land (die pad) part coupled to the light emitting elements, a terminal part for external connection, a lead-out wiring part for connecting them together, and the like. Examples of a material of the wiring include copper, nickel, palladium, rhodium, tungsten, chrome, titanium, aluminum, silver, gold, and an alloy of these substances. In particular, the copper or a copper alloy is preferable in terms of heat radiation performance. Moreover, provided on its surface layer may be a plating or a light reflective film of silver, aluminum, rhodium, gold, copper, or an alloy of these substances, among which the silver having excellent light reflectivity is preferable. These wiring can be formed through, for example, electrolytic plating, non-electrolytic plating, spattering, vapor deposition, printing, application, co-firing, or a post-firing method.

Light Emitting Element, First Light Emitting Element 20, and Second Light Emitting Element 30

For the light emitting elements, a semiconductor light emitting element such as an LED element can be used. The light emitting element includes at least a light emitting element structure, and further includes a substrate in many cases. A shape of the light emitting element in a top view is preferably a rectangle, and in particular a square or a rectangle elongated in one direction, but a different shape may be used. A side surface of the light emitting element (substrate in particular) may be substantially perpendicular to the upper surface or may inwardly or outwardly tilt. The light emitting element may have a structure having both a p-electrode and a n-electrode on the same surface side or a counter electrode (upper-and-lower electrode) structure in which the p-electrode and the n-electrode are provided separately on the upper surface and the lower surface of the element. The light emitting element with the structure having both the p-electrode and the n-electrode on the same surface side has each of the electrodes connected to the lead electrode or the wiring with a wire (face-up mounting) or has each electrode connected to the lead electrode or the wiring with a conductive bonding agent (flip-chip (face-down) mounting). The light emitting element with the counter electrode structure has the lower electrode connected to the lead electrode or the wiring with the conductive bonding agent, and has the upper electrode connected to the lead electrode and the wiring with a wire. The number of light emitting elements mounted in one light emitting device may be at least two, and two or more kinds of semiconductor light emitting elements may be combined together. The plurality of light emitting elements can be connected in series or in parallel to each other.

Substrates 25, 35

The substrate may be a substrate for crystal growth capable of growing a crystal of a semiconductor forming the light emitting element structure or a coupling substrate to be coupled to the light emitting element structure separated from the substrate for crystal growth. If the substrate has light transmissivity, the flip-chip mounting can easily be adopted and light extraction efficiency can easily be improved. If the substrate has electrical conductivity, the counter electrode structure can be adopted, and also power efficiency can easily be improved because it is easy to perform uniform in-plane power feeding to the light emitting element structure. Examples of a base material of the substrate for crystal growth include sapphire, spinel, gallium nitride, aluminum nitride, silicon, silicon carbide, gallium arsenic, gallium phosphide, indium phosphide, zinc sulfide, zinc oxide, zinc selenide, and diamond. As the coupling substrate, a light-blocking substrate is preferable. The light-blocking substrate is excellent in heat conductivity in many cases, and easily improves heat radiation performance of the light emitting element. More specifically, examples of material used for the light-blocking substrate include silicon, silicon carbide, aluminum nitride, copper, copper-tungsten, gallium arsenic, and ceramics. If the substrate is the coupling substrate, presence of a coupling layer (reflection layer) which suppresses traveling of light from the light emitting element structure into the substrate permits substrate selection, putting more priority to the heat conductivity and the electrical conductivity than optical characteristics. A thickness of the substrate is, for example, between 50 μm and 1000 μm (both inclusive), and preferably between 100 μm and 500 μm (both inclusive) in view of mechanical strength of the substrate and a thickness of the entire light emitting device. On the other hand, if the substrate has light transmissivity, a greater thickness is better in terms of luminous efficiency, more preferably between 200 μm and 900 μm (both inclusive), and even more preferably between 300 m and 900 μm (both inclusive).

Light Emitting Element Structure, Active Layers 21 and 31

The light emitting element structure contains a laminated body of semiconductor layers, that is, at least an n-type semiconductor layer and a p-type semiconductor layer, and preferably has an active layer therebetween. Further, the light emitting element structure may include an electrode and a protective film. The electrode can be formed of gold, silver, tin, platinum, rhodium, titanium, aluminum, tungsten, palladium, nickel, or an alloy of these substances. The protective film can be composed of oxide or nitride of at least one kind of element selected from the group consisting of silicone, titanium, zirconium, niobium, tantalum, and aluminum. An emission wavelength of the light emitting element structure can be selected from an ultraviolet region to an infrared region, depending on a material of the semiconductor and a ratio of its mixed crystal. A material used for the semiconductor preferably includes a nitride semiconductor, i.e. a material which permits emission of light of a short wavelength and which is capable of efficiently exciting the phosphor (mainly expressed as general expression $In_xAl_yGa_{1-x-y}N$, $0 \leq x$, $0 \leq y$, $x+y \leq 1$). Alternatively, for example, an InAlGaAs semiconductor, an InAlGaP semiconductor, zinc sulfide, zinc selenide, or silicone carbide can be used.

Sealing Member 40, Base Material 45

The sealing member is a member which seals, for example, the light emitting element to protect it from dust, external force, and the like. The sealing member preferably has electrical insulation properties. Moreover, the sealing member preferably permits transmission of light exiting from the light emitting element therethrough (preferably with a light transmittance of 70% or more). Examples of the base material of the sealing member include silicone resin, epoxy resin, phenol resin, polycarbonate resin, acrylic resin, TPX resin, polynorbornene resin, modified resin of these resin, and hybrid resin containing at least one of these kinds of resin. It may also be glass. Of these substances, the silicone resin or its modified resin is preferable since it is excellent in heat resistance and light resistance and has less volume shrinkage after hardening. In particular, the base material of the sealing member preferably primarily contains phenyl silicone resin. The phenyl silicone resin also has excellent gas barrier properties and easily suppresses deterioration in the lead electrode and the wiring caused by corrosive gas. The sealing member contains a phosphor in its base material. The sealing member preferably contains a filler and the like in its base material, but does not necessarily have to contain them.

Filler

As the filler, for example, a diffusing agent or a coloring agent can be used. More specifically, examples of the filler include silica, titanium oxide, magnesium oxide, magnesium carbonate, magnesium hydroxide, calcium carbonate, calcium hydroxide, calcium silicate, zinc oxide, barium titanate, aluminum oxide, iron oxide, chrome oxide, manganese oxide, glass, and carbon black. The filler has, for example, a spherical shape, an unstable granular shape, a needle-like shape, a columnar shape, a plate-like shape (including a scaly shape), a fibrous form, and an arborized (dendritic) shape. It may be hollow or porous.

Phosphor 50

The phosphor absorbs at least part of primary light exiting from the light emitting element and emanates secondary light of a different wavelength from that of the primary light. The phosphor may be composed of one kind or two or more kinds in combination. More specifically, examples of the phosphor include yttrium aluminum garnet activated by cerium, nitrogen-containing aluminocalcium silicate activated by europium and/or chrome, sialon activated by europium, silicate activated by europium, and potassium silicofluoride activated by manganese. Of these substances, the potassium silicofluoride activated by manganese is a phosphor with an emission peak wavelength in a red region, has a relatively narrow emission spectral line width, and is preferable for, for example, improving color reproducibility of a liquid crystal display.

Bonding Agent

The bonding agent is a member bonding the light emitting element to the base member. Examples of a material of an insulating bonding agent include epoxy resin, silicone resin, polyimide resin, and modified resin and hybrid resin of these resin. Examples of a material of an electrically-conducting bonding agent include an electrically-conducting paste of, for example, silver, gold, or palladium, or tin-bismuth-based, tin-copper-based, tin-silver-based, or gold-tin-based solder.

Wire

The wire is a conductive wire connecting together the electrode of the light emitting element and the lead electrode and the wiring. More specifically, a metal wire of gold, copper, silver, platinum, aluminum, or an alloy of these substances can be used. In particular, a gold wire in which fractures due to stress from the sealing member hardly occurs and which has excellent thermal resistance is preferable. Moreover, for the purpose of improving light reflectivity, at least a surface thereof may be formed of silver or a silver alloy.

EXAMPLES

Hereinafter, Examples according to the embodiment of the present invention will be described in detail. It is needless to say that the present invention is not limited to Examples described below.

First Example

A light emitting device of Example 1 is an SMD-type LED of a substantially rectangular solid shape which adopts the top view type and which has the structure of the light emitting device 100 in the example shown in FIG. 1.

A base member is a package which is 2.00 mm by 4.0 mm in size, which is of 1.2 mm in thickness, and which is formed by integrally molding a resin molded body with a pair of positive and negative lead electrodes. This package is manufactured by installing, in a mold, a machined metal plate (lead frame) formed of pairs of lead electrodes continuously and vertically and horizontally lying with a suspension lead in between, injecting a liquid constituent material of the resin molded body, solidifying it and separating it from the mold, and then cutting it (dividing it into individual pieces).

Each of the two lead electrodes is a plate-like small piece of a copper alloy of 0.2 mm in maximum thickness with its surface provided with silver plating. An exposed region of a lower surface of the two lead electrodes is substantially flush with a lower surface of the resin molded body, forming a lower surface of the package. Each of the two lead electrodes has a cut suspension lead part exposed on an end surface of the package (resin molded body).

The resin molded body has a rectangular shape so outlined as to be 2.0 mm by 4.0 mm in a top view with a maximum thickness of 1.2 mm, and is formed of epoxy resin containing silica and titanium oxide. Formed on an upper surface of the resin molded body, that is, a substantially central area of the upper surface of the package is a recess portion having a depth of 1.0 mm with an aperture of a rectangular shape which has round corners in a top view and which is 1.4 mm by 3.4 mm. A side wall surface of the recess portion is a tilted surface forming an angle of 111.3 degrees with a bottom surface of the recess portion.

Two light emitting elements are bonded at their substrate sides to the upper surface of the negative lead electrode formed on the bottom surface of the recess portion of the package (an element mounting surface) with a bonding agent of dimethyl silicone resin (of several micrometers in thickness). The first light emitting element is an LED element in which a light emitting element structure (of approximately 10 µm in thickness) containing an active layer made of a nitride semiconductor is laminated on a sapphire substrate (of 150 µm in thickness), which is capable of emitting blue light (with an emission peak wavelength of approximately 453 nm), and which is shaped into a rectangle of 550 µm by 750 µm in size in a top view. The second light emitting element is an LED element in which a light emitting element structure (of approximately 10 µM in thickness) containing an active layer of a nitride semiconductor is laminated on a sapphire substrate (of 800 µm in thickness), which is capable of emitting green light (with an emission peak wavelength of approximately 555 nm), and which is shaped into a rectangle of 550 µm by 750 µm in size in a top view. The first light emitting device has an n-electrode connected to the upper surface of the negative-side lead electrode with a wire and has a p-electrode connected to an n-electrode of the second light emitting element with a wire. The second light emitting element has a p-electrode connected to the upper surface of the positive-side lead electrode with a wire. The wire is a gold wire of 25 µm in diameter.

A sealing member, with which the recess portion of the package is filled, coats the two light emitting elements. The sealing member has phenyl silicone resin as a base member, and contains therein a phosphor (with an emission peak wavelength of approximately 630 nm) of potassium silicate fluoride activated by manganese and a filler of silica. The phosphor is eccentrically-located on a lower side (bottom surface of the recess portion) in the sealing member by settling. A thickness of a lower region (first region) where this phosphor lies is 600 µm, and a thickness of an upper region (second region) where substantially no phosphor lies is 400 µm. The upper surface of the sealing member is substantially flush with the upper surface of the package and substantially flat-surfaced (in a precise sense, a surface slightly recessed due to cure shrinkage). This sealing member is formed by dropping a liquid constituent material into the recess portion of the package with, for example, a dispenser, and then heating and solidifying it.

The light emitting device of Example 1 configured as described above can provide the same effects as those of the light emitting device 100 according to the first embodiment.

The embodiment of the present invention refers to a light emitting device including: a base member having an element mounting surface; a first light emitting element being provided on the element mounting surface, having an active layer of a nitride semiconductor, and having an emission peak wavelength in a blue region; a second light emitting element being provided on the element mounting surface, having an active layer of a nitride semiconductor, and having a longer emission peak wavelength than the emission peak wavelength of the first light emitting element; and a sealing member being provided on the element mounting surface, containing a phosphor excited by light of the first light emitting element, and sealing the first light emitting element and the second light emitting element, wherein the sealing member contains, in order from a side of the element mounting surface, a first region where the phosphor lies and a second region where the phosphor does not substantially lie, a height of an upper surface of the first light emitting element is a height in the first region, and a height of an upper surface of the second light emitting element is a height in the second region.

The embodiment of the present invention can provide a light emitting device which emits light of mixed colors of multiple wavelengths with high luminous efficiency while suppressing light loss of a nitride semiconductor light emitting element having a relatively long emission peak wavelength.

Obviously, numerous modifications and variations of the present invention are possible in light of the above teachings. It is therefore to be understood that within the scope of the appended claims, the invention may be practiced otherwise than as specifically described herein.

What is claimed is:

1. A light emitting device comprising:
a base having an element mounting surface;
a first light emitting element having an active layer of a nitride semiconductor and having a first emission peak wavelength in a blue region, the first light emitting element having a first upper surface and a first lower surface opposite to the first upper surface and being provided on the element mounting surface so that the first lower surface faces the element mounting surface;
a second light emitting element having an active layer of a nitride semiconductor and having a second emission peak wavelength longer than the first emission peak wavelength of the first light emitting element, the second light emitting element having a second upper surface and a second lower surface opposite to the second upper surface and being provided on the element mounting surface so that the second lower surface faces the element mounting surface; and
a sealing member provided on the element mounting surface to seal the first light emitting element and the second light emitting element, the sealing member comprising:
a first region containing a phosphor to be excited by light from the first light emitting element, the first region being provided on the element mounting surface, the first upper surface of the first light emitting element and a part of the second light emitting element being located in a portion containing the phosphor in the first region; and
a second region which does not contain the phosphor and which is provided on the first region, another part of the second light emitting element being located in the second region, the another part including the second upper surface of the second light emitting element,
wherein the element mounting surface has a first upper surface defining a lower stage and a second upper surface defining an upper stage,
wherein the first light emitting element is provided on the first upper surface of the lower stage, and
wherein the second light emitting element is provided on the second upper surface of the upper stage.

2. The light emitting device according to claim 1, wherein the active layer of the first light emitting element is located in the first region, and
wherein the active layer of the second light emitting element is located in the second region.

3. The light emitting device according to claim 1, wherein each of the first light emitting element and the second light emitting element has a substrate, and
wherein the substrate of the second light emitting element is thicker than the substrate of the first light emitting element.

4. The light emitting device according to claim 1, wherein the second emission peak wavelength of the second light emitting element is in a green region.

5. The light emitting device according to claim 4, wherein the phosphor has an emission peak wavelength in a red region.

6. The light emitting device according to claim 5, wherein the phosphor comprises potassium silicofluoride activated by manganese.

7. The light emitting device according to claim 1, wherein the phosphor comprises yttrium aluminum garnet activated by cerium.

8. The light emitting device according to claim 2, wherein each of the first light emitting element and the second light emitting element has a substrate, and
wherein the substrate of the second light emitting element is thicker than the substrate of the first light emitting element.

9. The light emitting device according to claim 8, wherein the second emission peak wavelength of the second light emitting element is in a green region.

10. The light emitting device according to claim 9, wherein the phosphor has an emission peak wavelength in a red region.

11. The light emitting device according to claim 10, wherein the phosphor comprises potassium silicofluoride activated by manganese.

12. The light emitting device according to claim 8, wherein the phosphor comprises yttrium aluminum garnet activated by cerium.

13. The light emitting device according to claim 3, wherein the second emission peak wavelength of the second light emitting element is in a green region.

14. The light emitting device according to claim 13, wherein the phosphor has an emission peak wavelength in a red region.

15. The light emitting device according to claim 14, wherein the phosphor comprises potassium silicofluoride activated by manganese.

16. The light emitting device according to claim 13, wherein the phosphor comprises yttrium aluminum garnet activated by cerium.

17. The light emitting device according to claim 1, wherein the first light emitting element is provided on a lead electrode, and
wherein the second light emitting element is provided on a lead electrode.

18. The light emitting device according to claim 1, wherein the element mounting surface has a main surface and a recess extending downward into a part of the main surface, the recess defining the lower stage and the main surface defining the upper stage, and
wherein the first light emitting element is provided on the lower stage within the recess.

19. The light emitting device according to claim 18, wherein the first region covers above an entirety of a bottom of the recess.

20. The light emitting device according to claim 1, wherein the portion containing the phosphor in the first region extends around an entire outer perimeter of the first light emitting element.

21. The light emitting device according to claim 1, wherein the first region directly contacts the lower stage.

22. The light emitting device according to claim 1, wherein the portion containing the phosphor in the first region extends around an entire outer perimeter of the part of the second light emitting element.

23. The light emitting device according to claim 1, wherein the phosphor is dispersed throughout an entirety of the first region.

24. The light emitting device according to claim 1, wherein the portion containing the phosphor directly contacts the part of the second light emitting element.

* * * * *